United States Patent [19]
Carter et al.

[11] Patent Number: 5,930,482
[45] Date of Patent: Jul. 27, 1999

[54] TRANSACTION CHECKING SYSTEM FOR VERIFYING BUS BRIDGES IN MULTI-MASTER BUS SYSTEMS

[75] Inventors: Hamilton B. Carter; William M. Lowe, both of Austin, Tex.

[73] Assignee: Advanced Micro Devices, Inc., Sunnyvale, Calif.

[21] Appl. No.: 08/904,504

[22] Filed: Jul. 31, 1997

[51] Int. Cl.⁶ .................................................. G06F 13/00
[52] U.S. Cl. ........................ 395/280; 395/555; 395/309
[58] Field of Search ................................ 395/280, 308, 395/309, 825, 555, 559, 180; 711/154, 167

[56] References Cited

U.S. PATENT DOCUMENTS

| | | | |
|---|---|---|---|
| 5,634,073 | 5/1997 | Collins et al. | 395/825 |
| 5,649,161 | 7/1997 | Andrade et al. | 711/167 |
| 5,774,681 | 6/1998 | Kunishige | 395/308 |
| 5,813,038 | 9/1998 | Thome et al. | 711/154 |

*Primary Examiner*—Gopal C. Ray
*Attorney, Agent, or Firm*—Conley, Rose & Tayon, PC; B. Noel Kivlin

[57] ABSTRACT

A transaction checking system and method to verify bus bridges in multi-master bus systems are described. A state machine model is created for each bus in the system. An initiator cycle list and a target cycle list store corresponding bus cycle state machine objects and transition their states according to bus signals. The bus cycle state machines provide a mechanism of persistent storage for other verification tasks. A bus bridge model may store a copy of each configuration register for the bus bridge, thereby monitoring current state of the bus bridge. False failures due to data merging, data collapsing and address remapping are avoided. A cache model and a cycle-based messaging system provide verification of proper cache master operation. Cache coherency errors may also be detected. A statistics keeping object may be created to monitor and store all pertinent performance information for the bus bridge. The transaction checking system may monitor the state of the bus bridge in a device independent manner and with tighter verification. The cycle-based approach to verification of internal states of a bus bridge results in a sound resolution of bus cycles with a better predictability of possible failures.

14 Claims, 8 Drawing Sheets

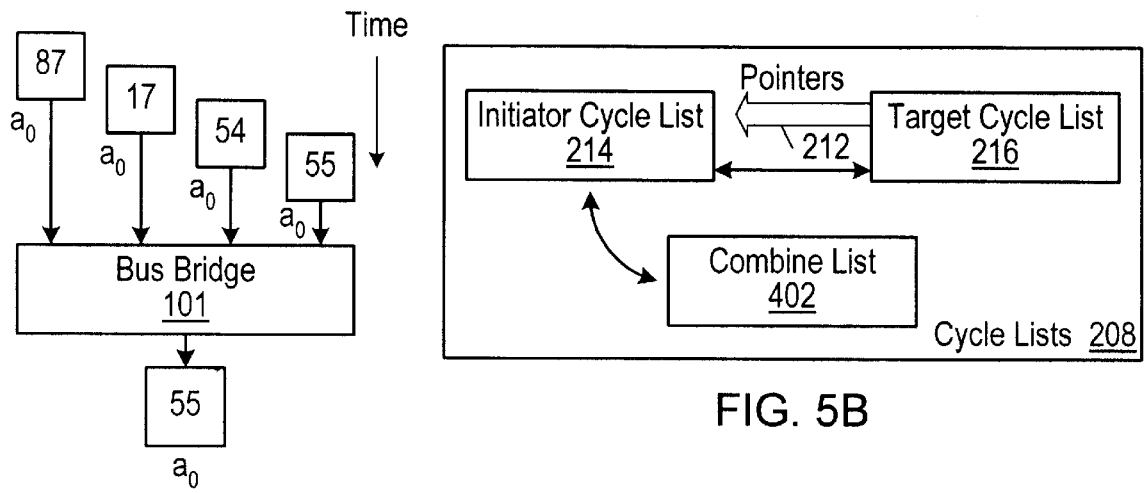
FIG. 5A
FIG. 5B
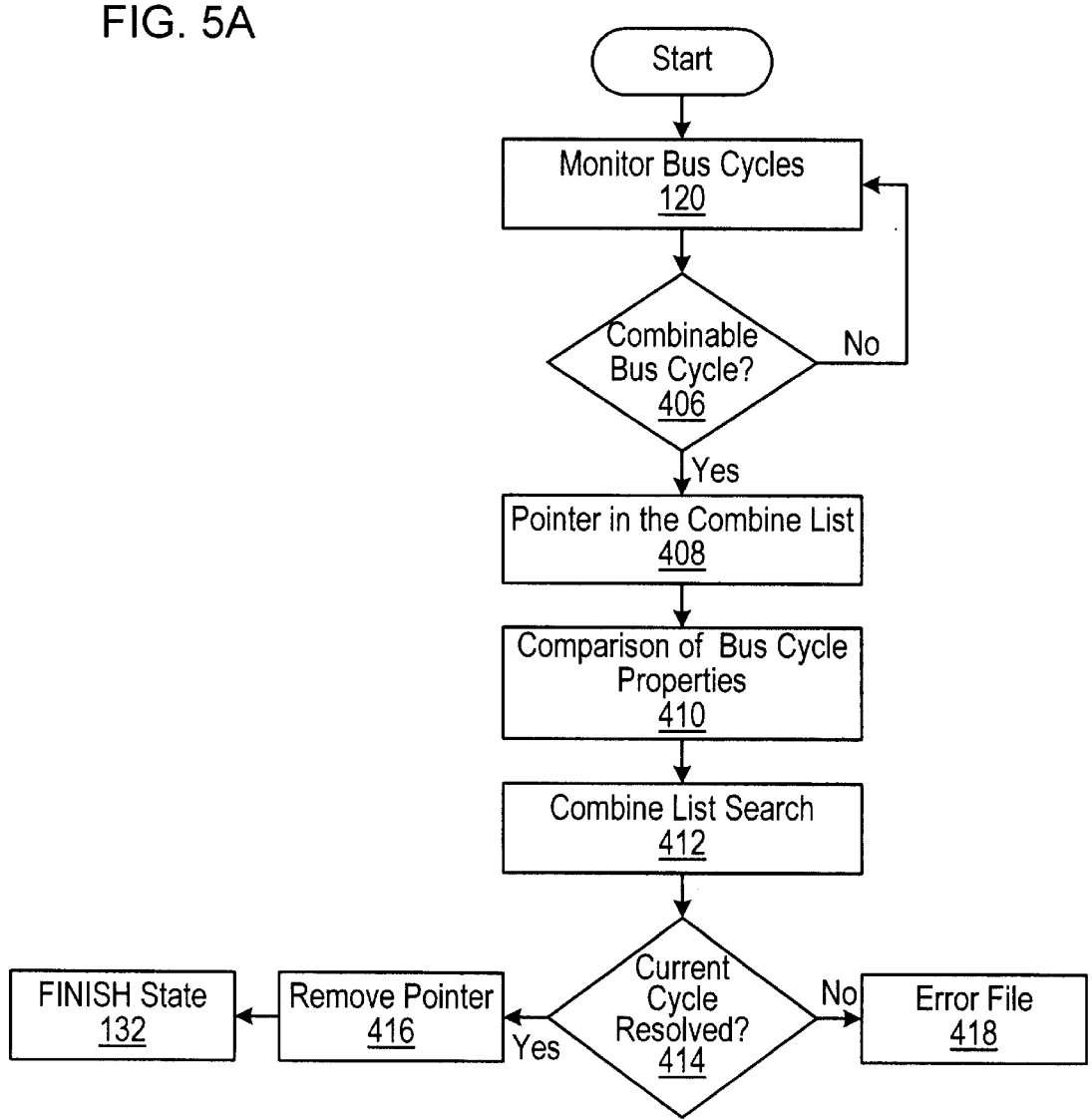
FIG. 5C

TRANSACTION CHECKING SYSTEM FOR VERIFYING BUS BRIDGES IN MULTI-MASTER BUS SYSTEMS

BACKGROUND OF THE INVENTION

1. Field of the Invention

The present invention relates to devices and methods for testing the functionality of components of a computer system and, more particularly, to object-oriented design methodologies for testing the functionality of bus bridge implementations for use with multi-master computer systems.

2. Description of the Related Art

Reliability and efficiency of any computer system depend in part upon the system complexity as well as upon the measures taken to minimize or prevent occurrences of faulty operations. Various modern-day mechanisms, including parallel processing, high-speed microprocessors, RISC (Reduced Instruction Set Computer) architectures and on-board hardware redundancies allow faster system performance and throughput while increasing system reliability. Particularly in relatively complex, high performance systems, it is important to provide means for testing the proper functionality of the system and to provide fault corrections both upon the design and manufacture of the various system components, and during system operation.

Monitoring and verifying the functionality of a particular design of a computer system component through software means has undoubtedly proven to be a reasonable alternative to manual verification methodologies and to purely hardware test systems. The use of software for system verification is not, however, entirely without its attendant costs. The time required to perform various tests may be lengthy. Furthermore, and perhaps of greater significance, is the fact that the overall accuracy or coverage of the tests may be limited, thus leading to indications of false failures or to undetected defects.

Corrupted bus cycles in a system can be a major source of loss of reliability or efficiency. It is not uncommon for bus cycles initiated by various bus masters to not reach their desired destinations, or to otherwise be corrupted. This can result from various factors, such as improper hardware design, faults in bus lines, physical or functional defects in chip or board fabrications, and faulty execution in system software routines. A key component in many computer systems which manages bus cycles is a bus bridge. Verification systems have thus been developed to verify the design of a bus bridge, either upon its initial design in a hardware description language such as Verilog or following actual hardware implementation.

Historically, verification systems for bus bridge designs have proven inadequate to preserve the right data and right address for every bus cycle in a system involving multiple transactions. One prior art method for testing the functionality of a bus bridge employs reference counts associated with each address being written to memory. The CPU decrements the count upon completion of the write operation. Although every address transaction is given its individual count, this method may fail to preserve address counts in bus bridge implementations that employ memory remapping.

False failures may also be caused by byte merging, i.e. merging of transactions to adjacent or contiguous memory addresses. In this scheme, for example, four cycles into the bus bridge may only create only one cycle out. This may result in the bus bridge erroneously incrementing in multiple counts without decrementing consistent with the merged transactions, thus leading to false indications of error.

Byte collapsing is another source of error in bus transaction verification schemes. In this approach, more than one write cycle to the same memory address may result in only the most recent data being preserved. In other words, the earlier data to the particular address may be overwritten by a later cycle. Here, as in byte merging, the bus bridge testing methodology may fail to preserve the correct address count.

Yet another source of error in previous bus transaction verification schemes is an occurrence of an aborted bus transaction. When cycles to addresses are aborted without being completed, failures occur if the system does not properly track and account for the aborted cycles.

Most transaction testing methodologies for bus bridges treat computer systems as address-based rather than cycle-based. Typical approaches to address and data verification do not take into account the internal states of a machine, nor any other internal states associated with a memory or other system cycles. Critical cycle oriented information may not be considered, causing inadequate verification. When critical bus cycle information is discarded, resolution of later arising cycle conflicts may not be completely sound.

Therefore, a bus bridge testing methodology and mechanism is needed to monitor the states of a bus bridge in a computer system to thereby determine proper functionality. Knowledge of the bus bridge states will allow better determination of failures. It is also desirable to have a verification system that monitors and records bus bridge performance, and verifies correct behavior of a bus bridge cache master.

SUMMARY OF THE INVENTION

The problems outlined above are in large part solved by a methodology and organizational structure for a bus bridge design verification system in which bus cycles are treated as individual persistent objects. Principles of object oriented design have been utilized to implement the system and methodology of the present invention.

A state machine model is created for each bus in the system. Each bus model (or bus object) is passed various stimulus generated on real or simulated system buses under test. As a bus object receives stimulus corresponding to new bus cycles, the bus object is responsible for instantiating corresponding bus cycle state machine objects and storing or identifying them in at least one of a plurality of bus cycle lists.

In one embodiment, there are three dynamically allocated lists for storing bus cycle state machine objects in the system. The first two lists hold cycles initiated by bus masters and cycles sent to bus targets, and are called the initiator cycle list and the target cycle list, respectively. The third list is a special purpose list for resolving initiator cycles when they have been modified due to a process called data combining or collapsing. This third list, referred to as the combine list, allows combinable bus cycles to also be predictably resolved.

The initiator cycle list and the target cycle list are passed the same stimulus generated for each bus object in the system, and the cycle lists, in turn, pass that stimulus to each bus cycle state machine object they contain. The cycle lists provide an organized structure for holding the bus cycles and passing the necessary stimulus to them so they may transition through their state machines. Each bus cycle state machine object transitions from state to state in response to certain stimulus signals according to the protocol of the associated bus. The state machine of each bus cycle state machine object transitions through its various states to verify and track the bus transaction according to the bus protocol and to collect address, data and clock cycle information, etc., as desired, to facilitate debug and fault correction.

The bus cycle state machine objects themselves are responsible for most of the transaction checking verification. The bus cycle state machines transition in response to bus signals according to the protocol of the associated bus. After protocol checking and completion of the bus transactions, each bus cycle state machine transitions into a respective holding state and remains therein until all data for the transaction associated with the bus cycle has been accounted for (e.g., corresponding transactions on target buses have been effectuated). False failures caused by merging of cycle data are no longer created due to data masking employed by the byte granularity data checking methodology of one embodiment.

Thus, the system monitors and stores various pertinent performance information associated with the bus bridge. Bus objects along with cycle lists and bus cycle state machine objects track resource usage and monitor bus bridge performance with the help of a statistics-keeping object.

In one embodiment, the bus bridge is monitored in a device independent manner, so that false failures can be eliminated and tighter verification of bus bridge operation can be accomplished. A bus bridge model object is created with storage space allocated for each of the bus bridge's configuration registers. Bus cycle state machine objects poll this bus bridge model to determine bus bridge state to thereby make decisions (e.g., remapping, DRAM configuration, etc.) regarding how the cycle should be resolved. Future bus bridge designs can also be tested in a device independent manner by simple modifications to the system disclosed.

In still another embodiment, a methodology provides detection of cache coherency errors in addition to detection of inefficient cache use by a cache controller. A cache model object is created with storage (or pointers to dynamically allocated storage) for the address, data and cache status (e.g., MESI states) of each cache line. A cycle list is further provided that stores pointers to non-cache bus cycles. The address and data contained by each cache line as well as the coherency state of the cache line (e.g., MESI state, or other cache coherency protocol state) is tracked in the cache model object. Non-cache bus cycles, in turn, poll the cache model object to determine their proper resolution. In addition, when cache updates occur, the cache model may be configured to invoke coherency tests upon non-cache bus cycle state machine objects to verify proper performance.

Thus, a transaction checking system and method according to the present invention may achieve automatic verification of bus bridges without being adversely affected by false failures caused by address remapping, byte merging or byte collapsing. A reliable and efficient method of monitoring system buses by simulation through object oriented designs is further provided.

BRIEF DESCRIPTION OF THE DRAWINGS

Other objects and advantages of the invention will become apparent upon reading the following detailed description and upon reference to the accompanying drawings in which:

FIG. 5A depicts a byte collapsing operation through a bus bridge.

FIG. 5B introduces a combine list for correctly resolving collapsed data cycles in posted write buffers.

FIG. 5C is an operational flow diagram for the arrangement in FIG. 5B.

Figure 1A:
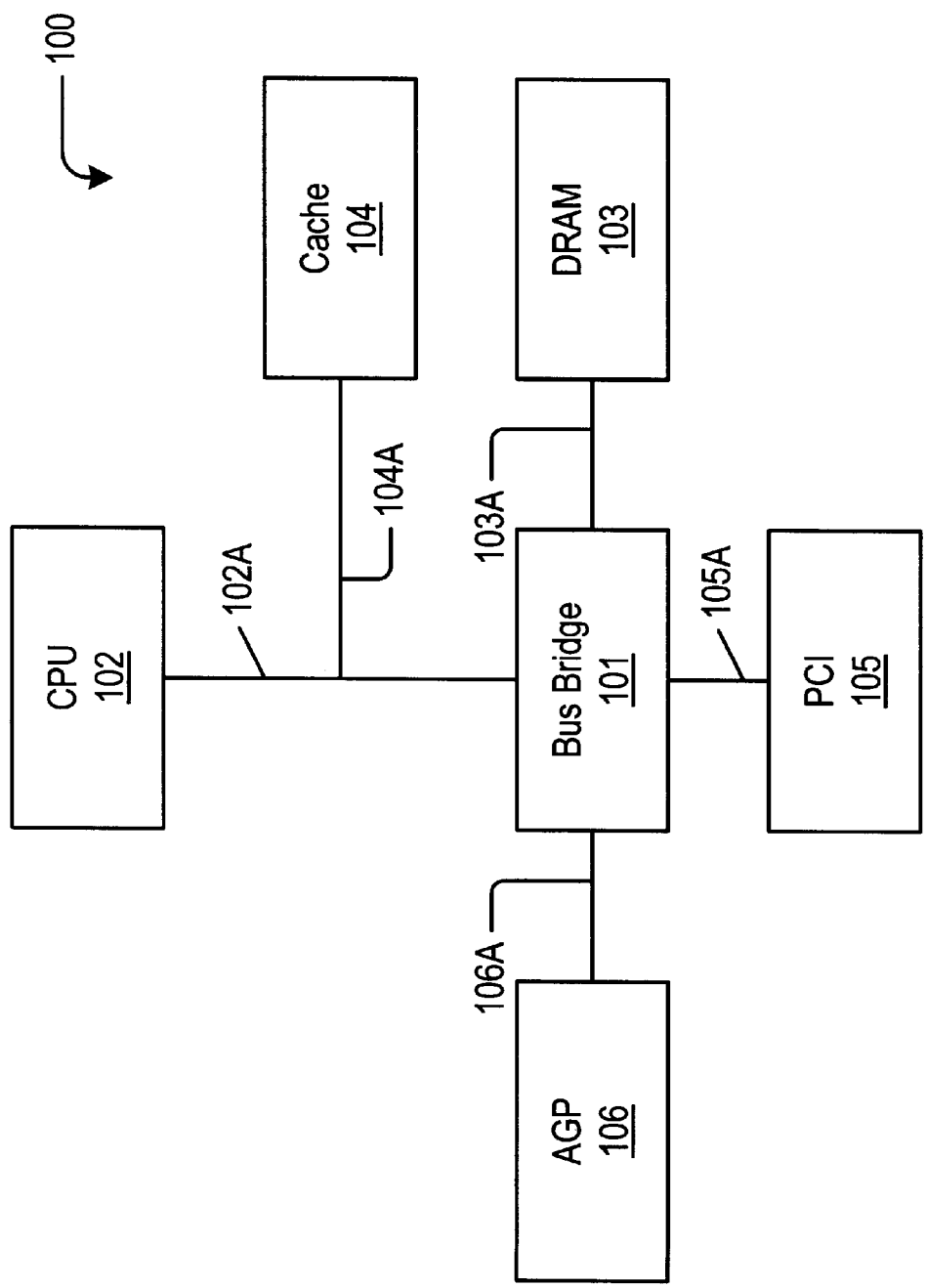
FIG. 1A is a block diagram of a computer system including a bus bridge.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF THE PREFERRED EMBODIMENT

Referring now to FIG. 1A, there is shown a general circuit layout of a computer system 100. A bus bridge 101 is shown connected to various system elements including a CPU 102, a DRAM memory 103, a cache 104 and one or more PCI (Peripheral Component Interconnect) devices 105. An Advanced Graphics Port (AGP) device 106 is also shown connected to the bus bridge 101. Various system buses 103A, 104A, 105A and 106A are also shown in FIG. 1A.

The bus bridge verification system of the present invention may be executable by the computer system 100, or by any other general purpose or specialized computer system. The bus bridge verification system as described below may be used to verify the functionality of a bus bridge design, such as bus bridge 101, either upon its initial expression in a hardware description language such as Verilog or following actual hardware implementation.

Figure 1B:
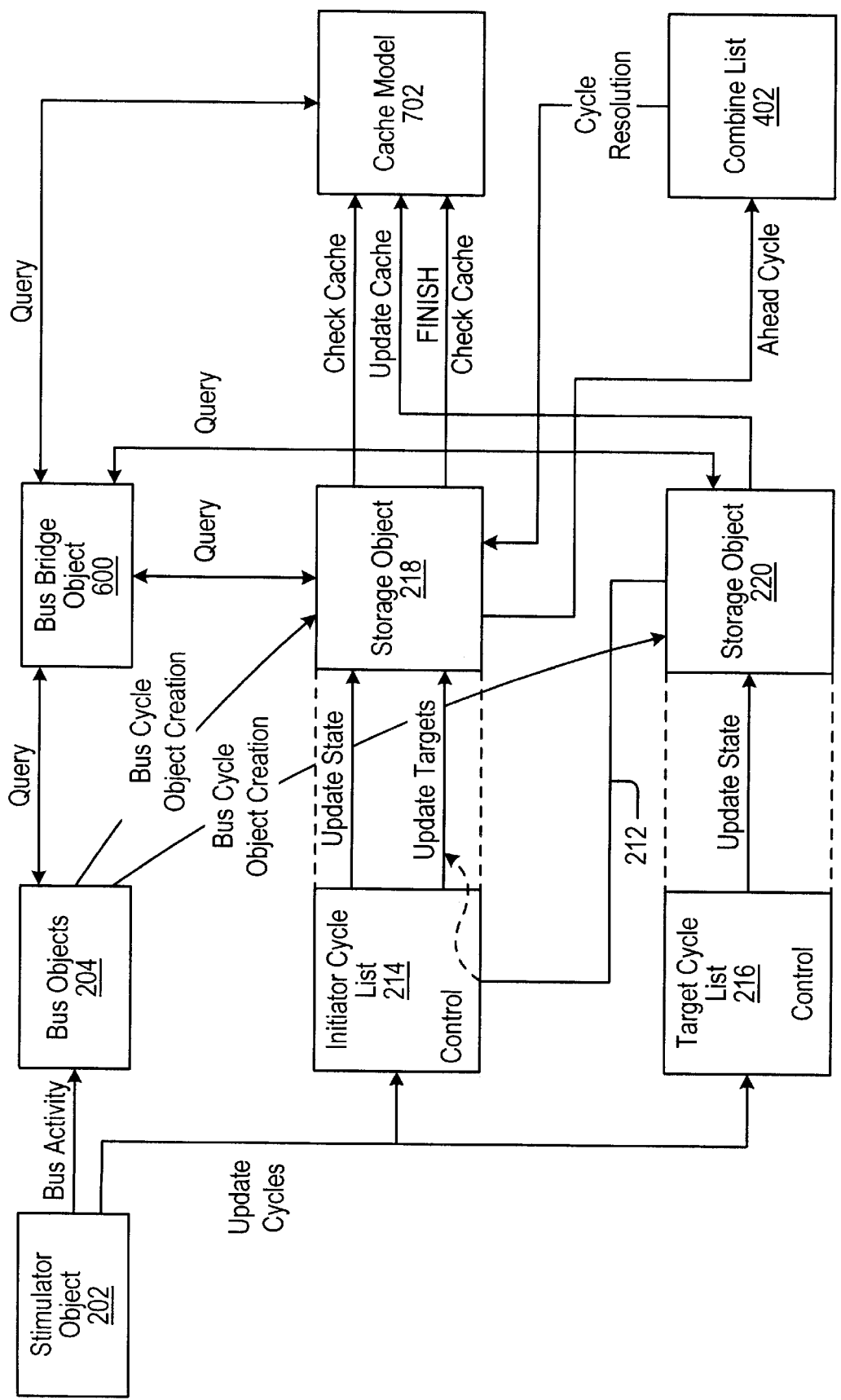
FIG. 1B is a command flow diagram of an object oriented bus bridge design verification system.

FIG. 1B is a general command flow diagram of one embodiment of a bus bridge verification system. As will be explained in further detail below, the bus bridge verification system treats bus cycles as individual persistent objects. Various additional objects are created to allow for the resolution of created bus cycles, as well as to allow for statistics keeping and other functionality.

In FIG. 1B, a stimulator object 202 is shown which passes bus stimulus on a clock cycle basis to a plurality of bus objects 204, and also to an initiator cycle list 214 and to a target cycle list 216. This bus stimulus corresponds to bus signal activity occurring on each of the buses associated with the bus bridge design being verified. Each bus is also modeled as an individual, persistent object as represented collectively by the block 204. Two storage objects, 218 and 220, are shown associated with their respective cycle lists 214 and 216 to store corresponding bus cycle state machine objects created by corresponding bus objects upon detection of the initiation of corresponding bus cycles.

The cycle lists, 214 and 216, are configured to pass the bus stimulus from the stimulator object 202 to their corresponding storage objects 218 and 220 so as to allow for updating of states of corresponding bus cycle state machine objects. A bus bridge model object 600 may be created as an object with storage space allocated for the bus bridge's 101 configuration registers. The bus bridge object 600 updates its registers using data received from the CPU bus object. Various bus cycle state machine objects may poll the bus bridge object 600 for information on the bus bridge's 101 currently-set configuration to thereby determine how cycles should be resolved.

A third cycle list, the combine list 402, interacts with the initiator cycle list 214 to resolve combinable bus cycles created during byte collapsing operations. Finally, a cache model object 702 is also created to detect cache coherency errors through interactions with the initiator cycle list 214 and the target cycle list 216. The cache model object 702 may also query the bus bridge object 600 to find configuration information pertinent to its operation, such as cache size, write-back or write-through cache, etc. Various detailed aspects of one embodiment of the bus bridge verification system of FIG. 1B are described next with reference to FIGS. 2 through 7B.

Figure 2:
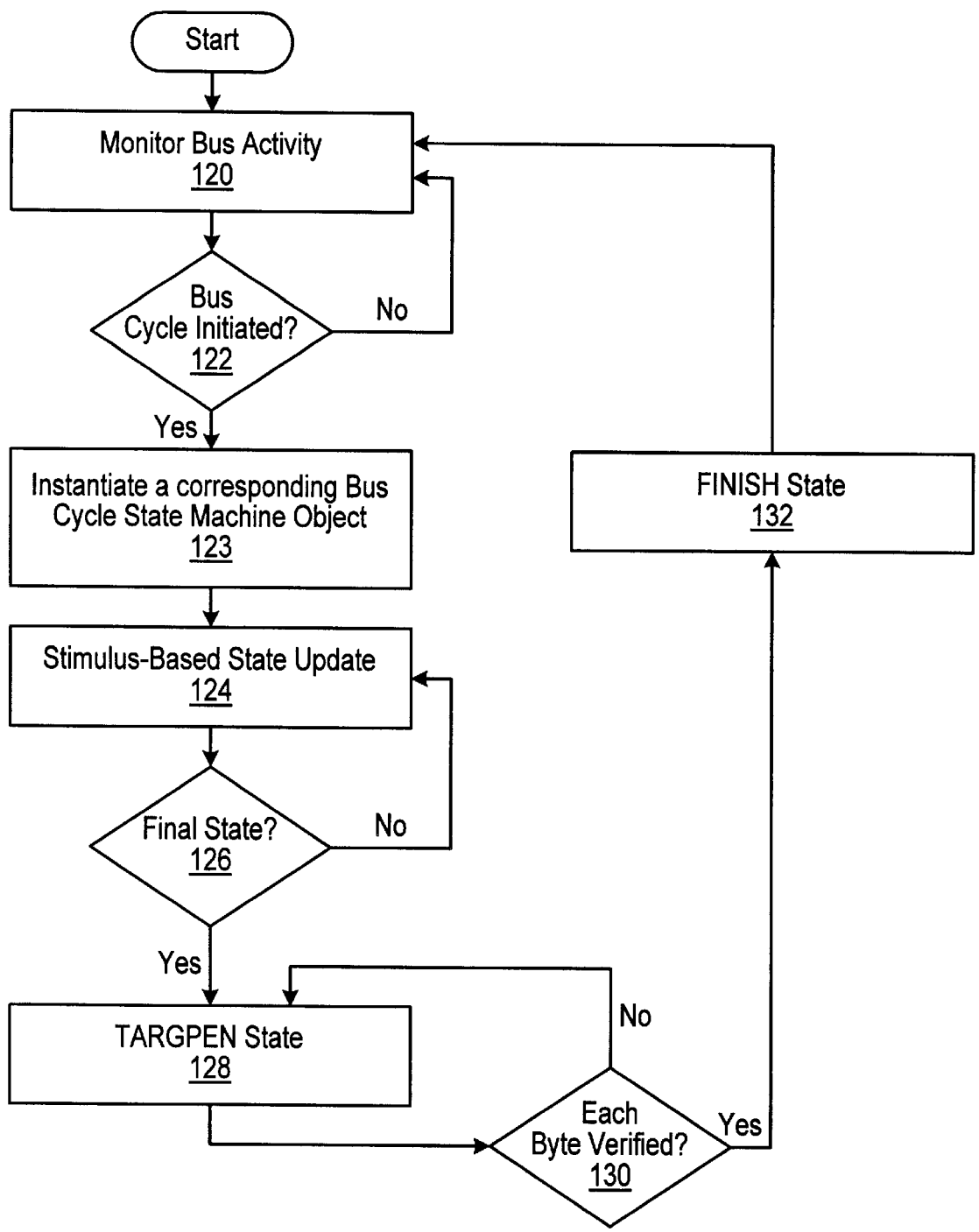
FIG. 2 is a flow chart for state machine based bus cycle completion checking.

Referring now to FIG. 2, a method for checking completion of each of a plurality of bus cycles is shown through a simplified flow chart. As depicted therein, initially, bus activity is monitored (step 120) by respective bus objects to detect the initiation of each bus cycle (step 122). Each bus cycle generated by the bus bridge system is described as a state machine object. As each bus cycle begins, a state machine object corresponding to that cycle is instantiated during step 123. For example, if there is a memory write cycle on the CPU bus 102A, then a state machine object for that cycle will be created. This cycle-based approach allows critical monitoring of the bus bridge functionality and avoids instances of false failures arising from address remapping, byte merging or byte collapsing, as will be described further below. Bus cycle state machine objects also provide a means of persistent storage for various other verification tasks.

Figure 3A:
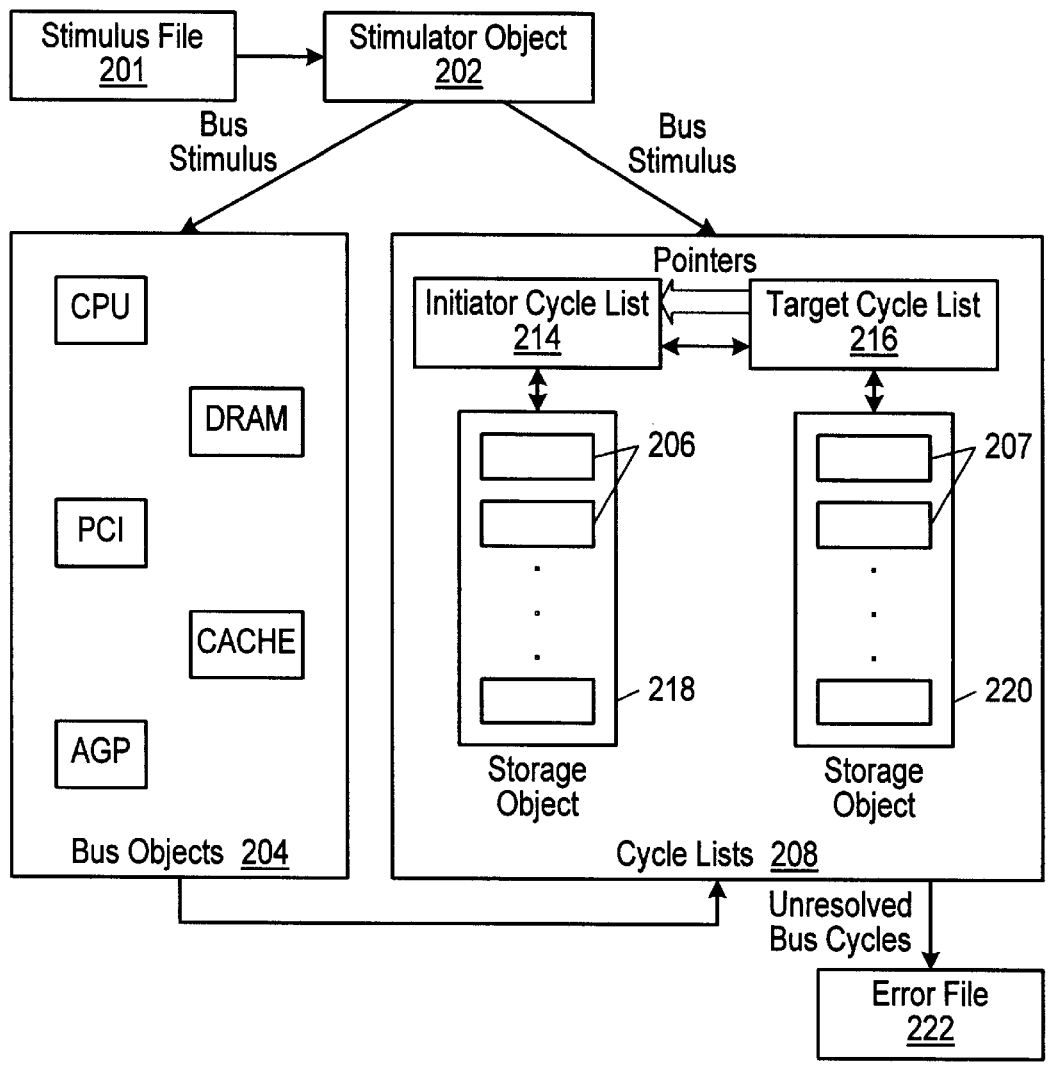
FIG. 3A shows the functional elements in a list based bus cycle resolution checking.

The bus cycle state machine object for a particular bus cycle contains storage for that bus cycle's properties such as clock cycle number, cycle address, cycle type (i.e. read or write), cycle data and the status of byte enables. A state machine object updates its state (step 124) based on the bus stimulus passed to it on each clock cycle. Referring to FIG. 3A, a stimulator object 202 is created to provide this bus stimulus to a plurality of cycle lists 208, which in this embodiment includes an initiator cycle list 214 and a target cycle list 216. Each cycle list, in turn, passes this stimulus to corresponding bus cycle state machine objects (206 and 207) stored therein. Additional aspects regarding this operation will be provided further below.

Referring back to FIG. 2, the final state in the state-machine based transition scheme of each bus cycle state machine object is a holding state, conveniently referred to as the TARGPEN state illustrated by step 128. The bus cycle state machine object remains in the TARGPEN state until the state machine verifies that each byte of its transaction is accounted for and has been routed to the proper destination (step 130). In other words, a bus cycle state machine object remains in the TARGPEN state until it is resolved by determining that any corresponding cycles on other buses have in fact, been effectuated. When all resolution checks are completed in the TARGPEN state 128 the state machine object transitions to the FINISH state illustrated by step 132 which signals that the bus cycle is complete and that the state machine object can be destroyed by the corresponding cycle list. Thus, state machine objects are created and destroyed on a bus cycle basis. This allows verification that the bus bridge is asserting signals correctly for each bus transaction. Further details regarding this operation are also provided below.

The stimulator object 202 in FIG. 3A reads all stimulus from a set, i.e. a stimulus file 201, of real or simulated buses associated with the bus bridge being verified. Cycles or other signals generated by the bus bridge being verified cause entries to be provided in the stimulus file 201. These stimulus are ultimately detected by a corresponding bus object (i.e., the bus object corresponding to the bus upon which the signal or cycle is generated). Upon detection of a cycle generated by the bus bridge, the corresponding bus object creates a bus cycle state machine object. For most cycles generated by the bus bridge, this bus cycle state machine object is provided to the storage object 220 associated with the target cycle list 216, since they are normally target cycles. Similarly, cycles generated by devices external to the bus bridge are also provided to the stimulus file, and may result in similar creations of bus cycle state machine objects. Bus cycle state machine objects that result from externally generated bus cycles are generally provided to storage object 218 associated with the initiator cycle list 214, since they are normally initiator cycles. However, it is noted that for certain types of cycles, a bus cycle state machine object may be provided to both the storage object 218 associated with initiator cycle list 214 and to the storage object 220 associated with target cycle list 216. For example, in one embodiment a bus cycle state machine object created as a result of a CPU writeback cycle is provided to both storage object 218 and storage object 220 associated with the initiator cycle list 214 and target cycle list 216, respectively. In addition, it is noted that certain bus cycle state machine objects created as a result of cycles generated by the bus bridge are provided to the storage object 218 associated with initiator cycle list 214 rather than to storage object 220, such as bus cycle state machine objects created as a result of cache line replacement read cycles from the cache memory.

It is also noted that the object oriented verification system may be applied to a bus bridge simulation model and that no physical components are needed to be connected. C++ language has been found to be well-suited for implementation of the verification system. Stimulus file 201 contains lines, each line storing a bus stimulus on a per clock basis. Logic analyzers can also be used to generate the stimulus file 201. Bus bridge performance can also be tested through externally simulated bus signals.

As stated previously, the stimulator object 202 passes the stimulus on a clock cycle basis to a plurality of bus objects 204 and also to a plurality of cycle lists 208. Both the bus objects 204 and the cycle lists 208 are stored in the memory of the computer system 100. The system treats each bus as an individual, persistent object as represented by the block 204 in FIG. 3A. Various bus cycles on system buses are also modeled as objects. Each bus object from the plurality of bus objects 204 monitors the stimulus passed to it by the stimulator object 202 to detect the initiation of a bus cycle. When a bus cycle is initiated, the bus object corresponding to the bus upon which the cycle occurs instantiates a bus cycle state machine object—collectively represented as blocks 206 and 207 in FIG. 3A—for that particular bus cycle. That bus object also simultaneously stores that instantiated bus cycle state machine object, 206 or 207, in one of the plurality of cycle lists 208 depending upon whether the cycle is an initiator cycle or a target cycle, as described above.

Thus, in the embodiment of FIG. 3A, each bus object is responsible for placing the created bus cycle state machine objects into the appropriate cycle list, 214 or 216. The bus objects 204 are also configured to pass available bus cycle creation data, i.e. the bus cycle's properties, such as initial cycle address, cycle type, clock cycle number and status of byte enables, etc., to individual bus cycle state machine objects upon their creation. The bus cycle state machine objects, 206 and 207, are configured to store their individual bus cycle's properties. The cycle lists 208 provide an organized structure for holding the bus cycle state machine objects 206 and passing the necessary stimulus to them so they may transition through their state machines. Thus, for example, when the CPU 102 attempts to write into the DRAM 103, the CPU bus object creates a bus cycle state machine object and stores it in the initiator cycle list 214; whereas, following generation of a corresponding cycle on the memory bus, the DRAM bus object creates another bus cycle state machine object and stores it in the target cycle list 216.

Figure 3B:
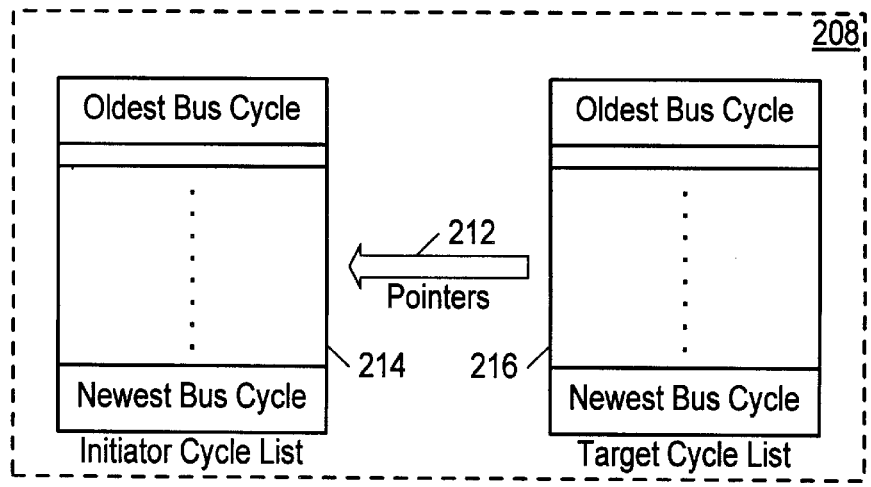
FIG. 3B depicts the pointer operation between the initiator cycle list and the target cycle list as part of bus cycle resolution checking.

In one embodiment, two cycle lists are created as illustrated in FIGS. 3A and 3B, block 208. Each cycle list itself is treated as an object. Cycles initiated by bus masters are stored in the initiator cycle list 214, whereas cycles sent to bus targets are held by the target list 216. Initially, on each clock cycle, each cycle list polls its bus cycle state machine objects for their current state. As described earlier in connection with FIG. 2, each bus cycle state machine object transitions through a sequence of states. Thus, when, during its polling, a cycle list finds a bus cycle state machine object in its FINISH state, it removes it from the list because that bus cycle has been successfully completed.

After initial polling, each cycle list passes the stimulus from the current clock cycle to each of the bus cycle state machine objects stored therein. As further depicted in FIG. 3B, bus cycles are stored, through their state machine objects, in an appropriate order. Thus, oldest bus cycles are stored at the cycle list head, and newest bus cycles are stored at the cycle list tail. Each line of stimulus in the stimulus file 201 is eventually fed to every bus cycle through the plurality of cycle lists 208, on a clock cycle basis. In one embodiment, the stimulus to the bus cycle state machine objects is passed in the order list head to list tail, i.e. from the oldest bus cycles to the newest bus cycles. Passing the stimulus to the bus cycles in this order facilitates various tasks, such as insuring that pipelined bus cycles claim the correct data from the bus, while keeping all cycles updated in their states. The bus cycle state machine objects transition their state machines accordingly, as described earlier with reference to FIG. 2.

Next, the initiator cycle list 214 passes a set of pointers 212 that point to bus cycle state machine objects in the target list 216 to each initiator bus cycle state machine object. The pointers 212 are provided to the initiator cycle list 214 from the target cycle list 216. The pointers 212 are passed to the oldest initiator bus cycle state machine object first. In one embodiment, a first pointer is passed to the oldest initiator bus cycle state machine object that points to the newest target bus cycle state machine object. This pointer is then successively passed to more recently occurring bus cycle state machine objects the initiator cycle list (i.e., stored in storage object 218). Subsequently, a pointer which points to the second most recent bus cycle state machine object in the target cycle list 216 is provided first to the oldest bus cycle state machine object in the initiator cycle list 214, and so on until it is passed to the newest entry in the initiator cycle list 214. This process is repeated until a pointer to the oldest bus cycle state machine object in the target cycle list 216 is provided to each entry of the initiator cycle list 214. As will be described further below, these pointers are used by each bus cycle state machine object 206 associated with the initiator cycle list 214 to pair it with a bus cycle state machine object 207 associated with the target cycle list 216 to determine whether the paired cycles resolve, or partially resolve, each other.

It is noted that in other embodiments, other methodologies are possible for allowing initiator bus cycle state machine objects to pair with corresponding target bus cycle state machine objects for cycle resolution. For example, while in the embodiment described above a pointer to the newest bus cycle state machine object in the target cycle list 216 is provided first to the oldest entry in the initiator cycle list 214, and successively to the oldest entry in the initiator cycle list 214, and so on, in other embodiments, the specific order in which pointers are passed between the cycle lists for cycle pairing may be varied.

If an initiator bus cycle state machine object has transitioned to its TARGPEN state 128 (FIG. 2)—(i.e. a state indicating that the bus protocol for the corresponding cycle was properly completed and only resolution of target data is pending), or if an initiator cycle state machine object has transmitted at least one data packet as may occur, for example, during a PCI burst cycle that writes to DRAM, then that initiator bus cycle state machine object polls the corresponding target bus cycle state machine object (i.e., the target bus cycle state machine object that is pointed to by the current pointer passed to the initiator bus cycle state machine object) for the target bus cycle state machine object's properties. These properties include cycle type, cycle address, cycle byte enables, cycle data, and others, as desired. If each of these properties matches the predetermined resolution properties for the initiator cycle state machine object, the data for that initiator cycle is marked as resolved. As described further below, when matching data for cycles are found, the byte enable bits for that data are cleared. When all the byte enables for a particular cycle have been cleared, thus indicating a complete resolution for the cycle, it enters the FINISH state and is removed from the cycle list.

Two storage objects, 218 and 220, may be provided which are associated with their corresponding cycle lists 214 and 216 (FIG. 3A) to store corresponding bus cycle state machine objects. At the end of a simulated test, the system may still have a number of unresolved bus cycles in the initiator cycle list 214. Each of these unresolved bus cycle state machine objects remains in the corresponding storage object to facilitate debugging. The number and complexity of cycle lists 208 as well as of storage objects can be varied depending on the test requirements of the application at hand. The storage objects can either be separately associated with cycle list objects or can be incorporated as an integral part of each. An error file 222 may be created to store all pertinent information about unresolved initiator and target cycles. This file can later be accessed by a user for inspection or debugging purpose. All these objects are stored in appropriate system memory.

Figure 4A:
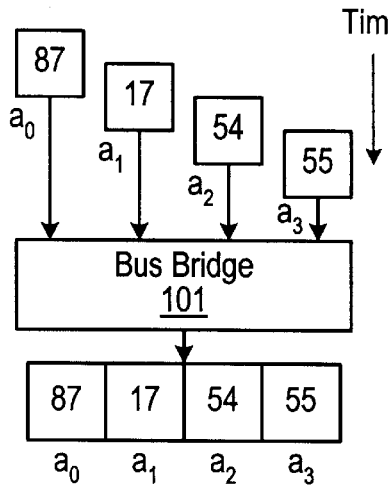
FIG. 4A shows a data merging operation performed by a bus bridge.

A further implementation of the system addresses the situation of byte merging. As discussed above, previous methodologies have suffered from false failures due to data merging performed by the bus bridge to enhance performance. FIG. 4A generally depicts a situation where a bus bridge 101 merges transactions to adjacent or contiguous memory addresses. Four cycles into the bus bridge 101 result in only one cycle out (e.g., to DRAM 103). Previous methodologies assumed that at least one target bus cycle would exist for each initiated bus cycle. This assumption caused verification systems to flag incorrect data for initiator cycles that did not utilize all bytes on the bus. In the present embodiment, a methodology is provided which tracks cycle data with byte granularity.

As described earlier, byte enables, among other cycle properties, are stored along with each instantiated bus cycle state machine object. It was also mentioned before with reference to FIG. 2 that when each instantiated cycle object completes its state machine (i.e., the bus transaction has completed), it enters a holding state called the TARGPEN state, represented by block 128 in FIGS. 2 and 4B.

In this TARGPEN state 128 or after at least one data packet has been sent by an initiator cycle, as may occur, for example, during a PCI burst cycle that writes to DRAM, the initiator bus cycle state machine object compares its cycle properties to those of a paired target bus cycle state machine object (which is pointed to by the current pointer it received from the initiator cycle list 214), as already discussed above with reference to FIGS. 3A and 3B. In the present embodiment, rather than comparing an entire bus width of data, the initiator bus cycle state machine object logically masks, e.g. with a logical OR, its byte enables with those of the pointed-to target bus cycle state machine object. Byte enables are only compared when the initiator and target cycles have the same cycle address (or corresponding bus cycle addresses, in situations where address translation has occurred within the bus bridge (such as, for example, certain AGP operations)) and are of the same type (i.e., read or write), as represented by block 301 in FIG. 4B. Data itself it compared only when the initiator and the target cycles have one or more common byte enables, as represented by the block 302 in FIG. 4B. After this step, each enabled data byte is compared to find matching data, as shown by the blocks 304, 306, 307 and 308. When a data byte is found matching in the paired bus cycle state machine objects, the bus cycle state machine object in the initiator cycle list 214 (FIG. 3A) toggles (or clears) the byte enable bit associated with it so that the data byte is considered no longer enabled. That initiator cycle state machine object then instructs the target cycle state machine object to toggle its corresponding byte enable in the same manner as represented by block 310 in FIG. 4B. The clearing of the target cycle byte enable prevents more than one initiator cycle from using the same target cycle data and also allows target cycles to be removed from the target cycle list 216 when all their data have been used (i.e., when all byte enables for the cycle have been cleared). The data corresponding to any other common byte enables in the paired initiator-target cycles are similarly compared to selectively clear the byte enables.

Figure 4B:
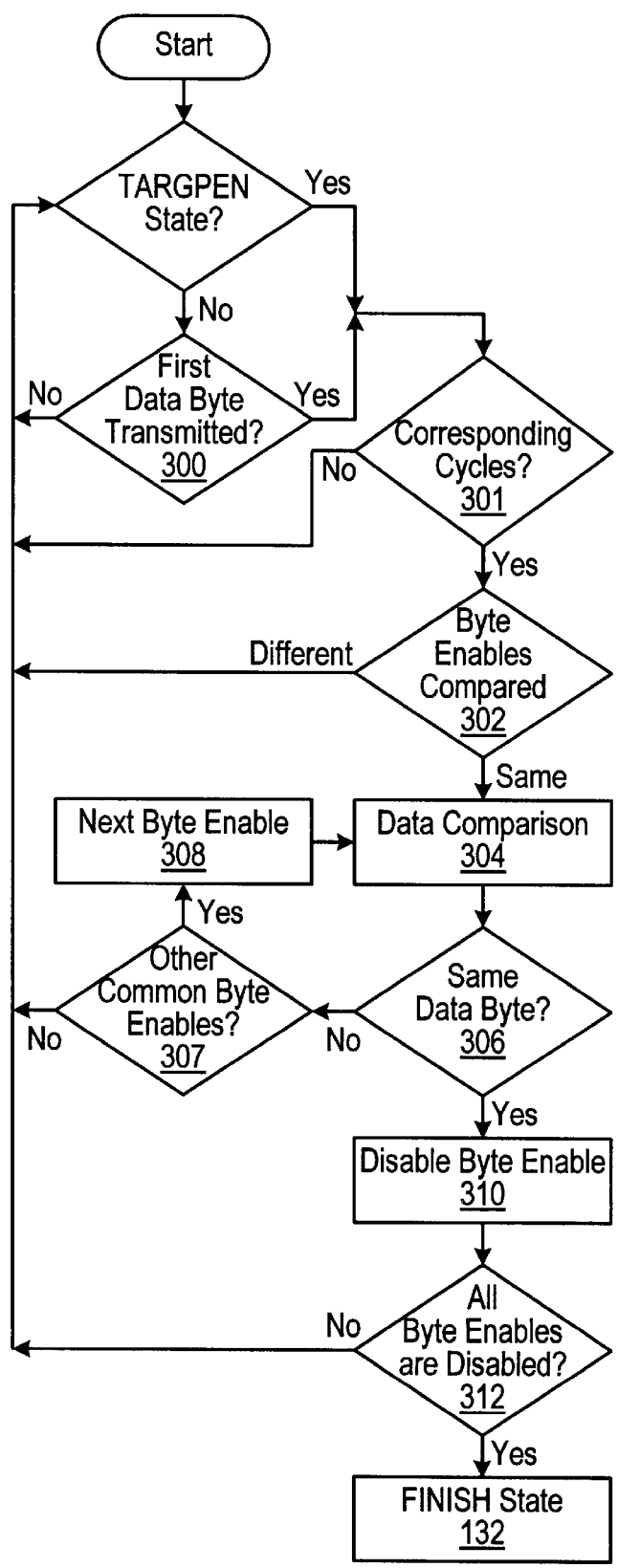
FIG. 4B shows a method of byte granularity data checking to eliminate misresolved bus cycles during data merging.

The initiator cycle state machine object remains in the TARGPEN state until all of its byte enables are no longer asserted, as depicted by block 312 in FIG. 4B. When the initiator cycle object exits from its TARGPEN state and enters a FINISH state 132 (also shown in FIG. 2), it is an indication that all of its data have been accounted for. The discussion for this embodiment assumes that the system data bus is 32-bit wide, and hence, there can be four data bytes per clock cycle. Further, there can be four byte-enables too, one for each data byte. However, it is clear from this discussion that the system can be modified to adapt to different bus widths, e.g. 8-bit data bus, 16-bit data bus, 64-bit data bus etc., and to other specific system requirements.

It is noted that after a particular bus cycle state machine object in the initiator list performs the resolution check as depicted in FIG. 4B with a paired bus cycle state machine object in the target list, the initiator cycle list will cause the pairing of other initiator-target cycles (i.e., through the passing of pointers as described above) to continue the resolution checking process. This process is on-going as long as there are bus cycle state machine objects in the initiator and target lists.

As briefly described before, previous transaction checkers have also produced false failures due to a process called data combining or byte collapsing used by bus bridges to improve performance. Byte collapsing is distinct from byte merging. When two or more subsequent cycles are to the same address, the bus bridge 101 may throw away the first cycles and only propagate the data of the most recent cycle as shown in the situation depicted by FIG. 5A. The manner in which data combining or byte collapsing is handled to properly resolve bus cycles in one embodiment of the system is described next.

Referring to FIG. 5B, in addition to the two cycle lists described previously, i.e. the initiator cycle list 214 and the target cycle list 216 as collectively illustrated by the block 208 in FIG. 3A, a third cycle list may also be created. The third list is called the combine list and is shown as block 402 in FIG. 5B. This combine list 402 is a first-in-first-out (FIFO) list with the number of entries equal to the number of entries in the bus bridge's posted write buffer. As with the initiator and target cycle lists, the combine cycle list is also an object stored in the appropriate system memory.

As discussed in connection with FIG. 3A, each bus object from a plurality of bus objects 204 monitors the stimulus passed to it by the stimulator object 202 to detect the initiation of a bus cycle. This is also represented by the block 120 in FIGS. 2 and 5C. As each combinable bus cycle is created, i.e. a cycle wherein bytes are collapsed as depicted in FIG. 5A, each bus cycle state machine object associated with the combinable bus cycle places a pointer to itself in the combine list 402 during step 408. When a bus cycle state machine object, in the initiator cycle list 214, for that combinable bus cycle transitions through its states and enters a holding state or if that bus cycle state machine object has transmitted at least one data packet, the initiator cycle list 214 polls the target cycle list 216 for a corresponding matching bus cycle state machine object, as discussed above with reference to FIG. 3B, during step 410.

If a bus cycle state machine object in the initiator list finds a target cycle that matches its address, one or more byte enables and target cycle type, but has different data, then the initiator cycle list 214 searches the combine list 402 during step 412 for an initiated bus cycle having cycle, address and byte enable attributes identical to those for the combinable bus cycle, but a later clock cycle number. If such a cycle is found and the cycle's data matches the data from the target cycle, then the initiator cycle list marks that byte enable bit for the original data-mismatched combinable initiator cycle as resolved (i.e., clears the byte enable bit). In addition, the pointer to the resolved initiator bus cycle state machine object is removed from the combine list 402. The resolution checking of subsequent initiator bus cycle state machine objects is handled similarly. When the initiator bus cycle state machine object that corresponds to the last cycle involved in a combined target cycle undergoes its resolution checking process as described above, that object will resolve with the target bus cycle state machine object of the combined cycle. Additionally, the pointer to that initiator bus cycle state machine object in the combine list 402 is removed upon resolution.

When a cycle is combinable, even if the appropriate data and address resolutions are found from a DRAM cycle—i.e. a target cycle, it may be advantageous to first check the combine list 402 for any cycle ahead of the current combinable cycle that uses the same data and address, as is also generally shown in FIG. 1B. If such a cycle is found, then the initiator list 214 may be configured not to allow the current combinable cycle to claim resolution from that DRAM cycle. Instead, the initiator cycle list may allow the newest cycle in the combine list 402 with that address and data to claim resolution from the DRAM cycle, and may resolve all previous cycles with that data and address from the newest cycle in the combine list 402. Using the combine list technique disclosed in the present embodiment, the latest cycle would not see a DRAM data mismatch.

As each combinable bus cycle completes—i.e. transitions through its protocol checking state machine and resolves all its data according to the methodology described herein, it sends a message to the combine list. The combine list 402, in turn, removes the pointer to that combinable cycle upon receipt of this message during steps 414 and 416. The combinable bus cycle state machine object, having been completely resolved, thus enters into its FINISH state 132 (FIG. 5C) indicating cycle completion as discussed earlier in connection with FIG. 2.

The length of the pointer in the combine list can vary depending on the implementation. In one specific embodiment, the maximum pointer length is about four bytes. Further, during a test, there may be occasions when the combinable cycle is not fully resolved. In such a situation, the unresolved bus cycle state machine objects remain in their corresponding storage objects—i.e. unresolved initiator cycles will remain in the storage object 218, whereas unresolved target cycles will remain in the storage object 220 (FIGS. 1B and 3A). The concept and functions of the storage object were discussed previously with reference to FIG. 2A.

The initiator and the target cycle lists can be configured to be responsive to a user request to download any pertinent information about unresolved bus cycles to a file for inspection and debugging. In one embodiment, an error file 222 (FIG. 3A) stores all pertinent information about unresolved initiator and target bus cycles (block 418, FIG. 5C), except for any unresolved target cycle reads, which can be destroyed without being reported. For example, any unresolved DRAM reads can be destroyed without reporting them in the error file. Further, a system-wide cycle history file can also be created to store history of each bus cycle—whether resolved or not—in the system.

Figure 6:
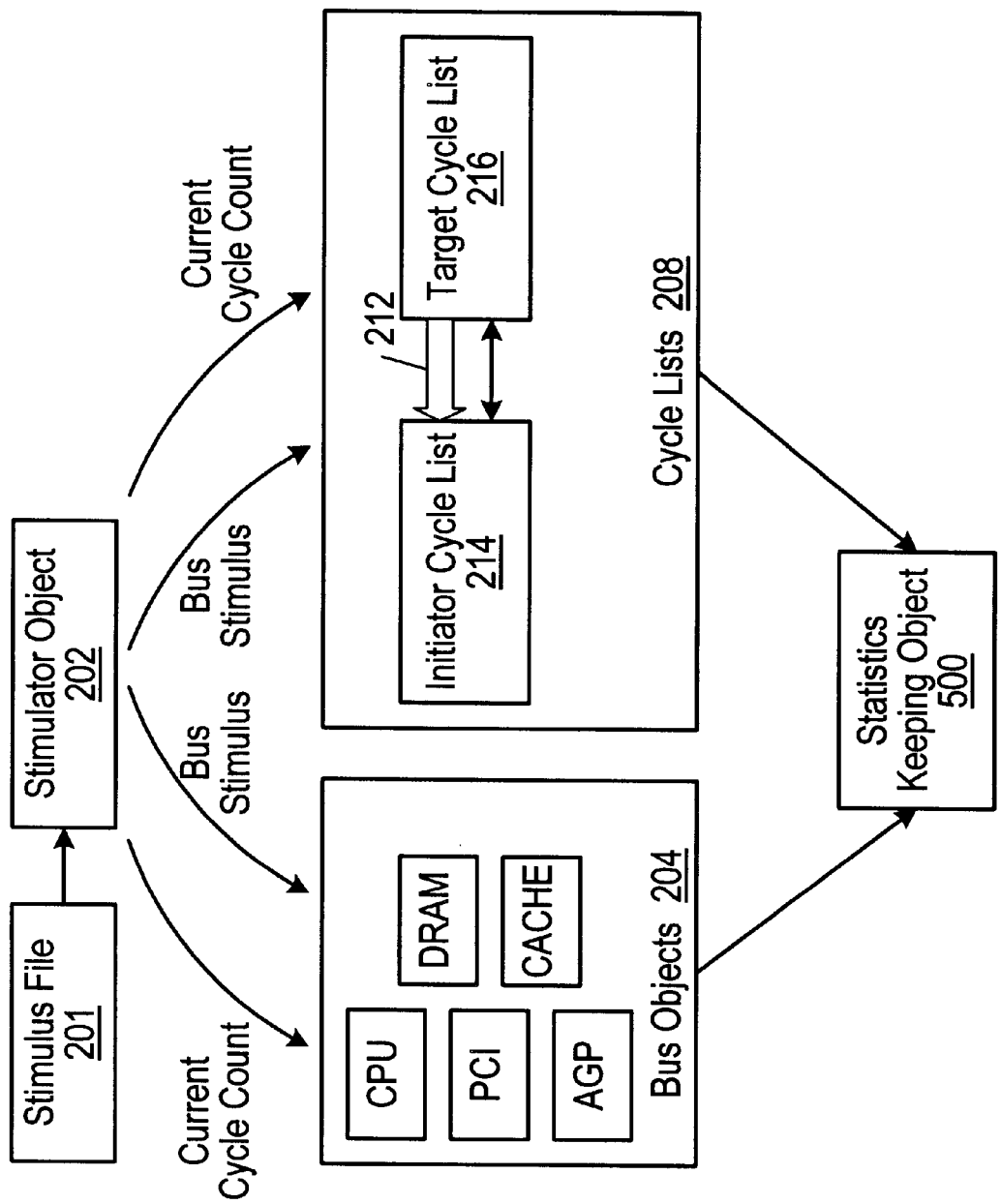
FIG. 6 depicts linked objects to statistically monitor performance and resource usage in a bus bridge system.

In a further implementation, bus bridge performance and resource usage may also be monitored. As earlier described in connection with FIGS. 2 and 3A, bus objects 204 and bus cycle lists 208 receive a bus stimulus from the stimulator object 202 on a clock cycle basis. This stimulus can be provided through a stimulus file 201. The stimulator object may further be configured to also pass, on a clock cycle basis, the current cycle count to each object, 204 and 208, in the bus bridge verification system. A statistics keeping object 500 or monitor object is created and stored in the system memory. The statistics keeping object 500 is linked to the cycle lists 208 and to the bus objects 204 as shown in FIG. 6.

By keeping a stored cycle count for each state transition, each bus cycle object can send elapsed time information to statistics keeping object 500 for performance monitoring. The cycle lists 208 report resource usage by tracking the type and number of cycles that enter the bus bridge 101 (FIG. 1A). The monitor object 500 then tracks the number of pending cycles that accumulate within the bus bridge. Messages are sent to the statistics keeping object on each clock cycle indicating the current usage of each tracked resource.

Some uses of the statistics keeping system may include, but are not limited to, the following: (1) Cycle completion monitoring and test coverage by bus cycle type can be tracked with the messages from bus cycle state machine objects; (2) Request to grant latency monitoring and arbitration scheme verification can be tracked with messages from different state machines of the bus objects 204; and (3) Usage of the bus bridge's posted write buffer can be monitored with messages from the cycle lists 208.

By monitoring the state of the bus bridge in a device independent manner, false failures can be eliminated and tighter verification of bus bridge operation can be accomplished.

Referring back to FIG. 1B, in this embodiment, a model of the bus bridge 600 is created as an object with storage space allocated for a copy of each of the bus bridge's configuration registers. This object is also suitably stored in the appropriate system memory. As described with reference to FIG. 3A, each bus cycle state machine object also monitors the stimulus (from the stimulator object 202) passed to it. As the CPU write cycle state machine object monitors the stimulus, it sends bus cycles intended for the bus bridge 101 to the bus bridge object 600 also. Using the data from these cycles, the model 600 updates its configuration registers accordingly. In this manner, the current configuration state of the bus bridge 101 is always known.

Because the bus bridge model 600 obtains its data directly from the CPU write cycle state machine objects, the implementation is not dependent on the actual bus bridge physical implementation. Future bus bridge designs can be tested using the same verification system by simply providing a new bus bridge model, in software, with the proper configuration register mapping, allowing direct ports for the rest of the verification system objects.

The bus bridge model object 600 provides query functions that return information on the bus bridge's state based on function input parameters. By way of example only, bus cycle objects—i.e. the bus cycle state machine objects stored in one or more of the cycle lists 208 (FIGS. 1B and 3A)—can directly poll the bus bridge object 600 to determine if their address is remapped by the bus bridge 101. This effectively eliminates the problems occurring in previous methodologies where bus bridges failed to preserve address counts in situations involving memory remapping. Bus cycle objects can also poll the bus bridge model for information on their target resolution source. For example, CPU cycles can poll the bus bridge model 600 for DRAM or PCI cycle resolutions when a CPU cycle has a DRAM cycle or a PCI cycle as its target. This allows the bus cycle state machines to verify that the bus bridge 101 is asserting correct signals in each bus protocol. In addition to the bus cycles, various bus objects 204 (FIG. 3A), through their state machines, can also poll the bus bridge model 600 for pertinent information. For example, an AGP bus object can query the bus bridge object 600 to determine its operating mode, i.e. a piped mode or an SBA mode. Finally, a cache model object 702 (described below) can also be configured to query the bus bridge object 600 to find information about cache configuration, such as cache size, write-back or write through cache, etc.

In a bus bridge verification methodology, it may also be important to verify cache operation. Further, non-cache bus cycles should be able to determine if their resolving target cycles should come from the cache or DRAM when the bus bridge model 600 (FIG. 1B) indicates that the resolving target cycles should come from the memory susbsystem. In accordance with one embodiment, a verification methodology for checking that cache coherency is preserved by a cache controller is employed.

Figure 7A:
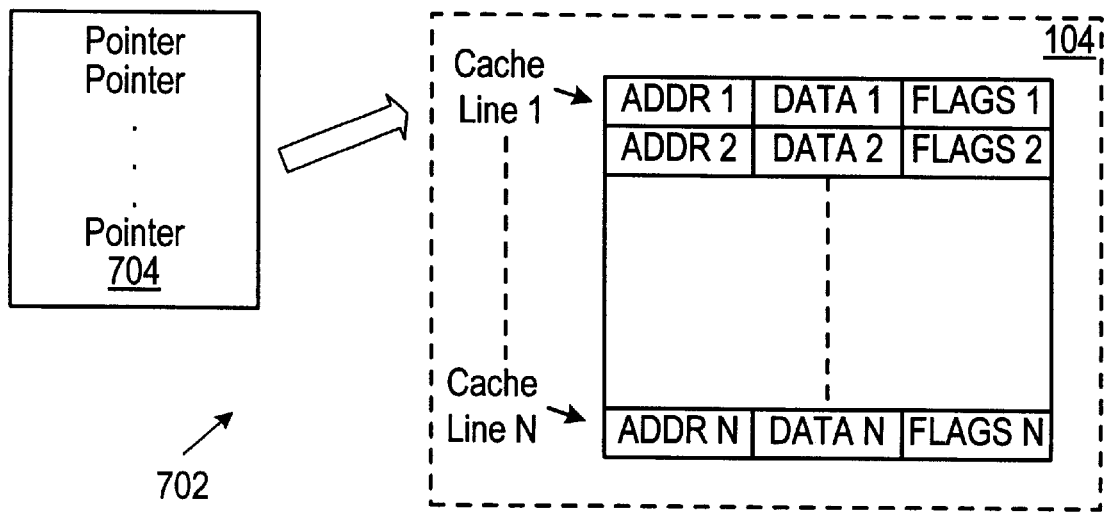
FIG. 7A shows a cache model object created to check cache coherency.
Figure 7B:
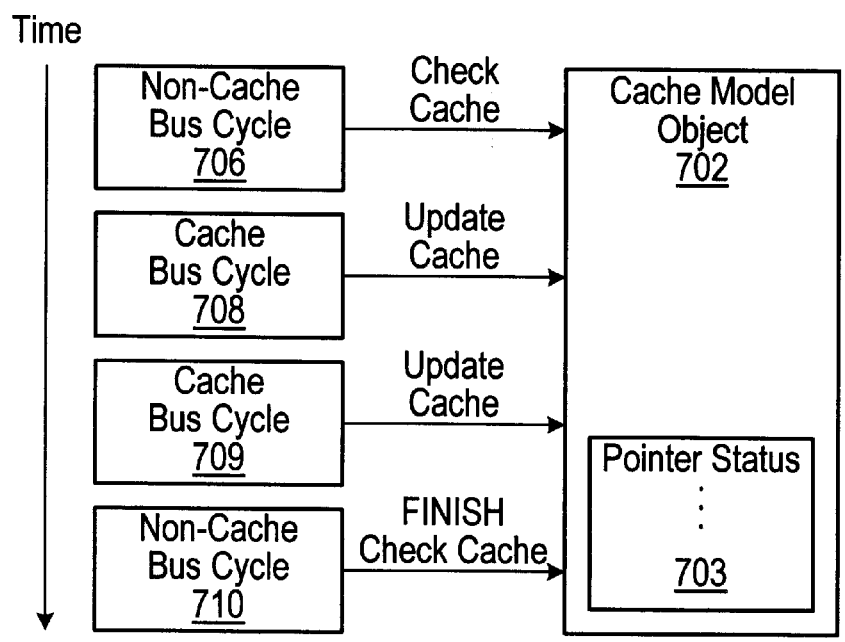
FIG. 7B is for a verification methodology using the cache model object in FIG. 7A to check cache coherency during cache and non-cache bus cycles.

Referring now to FIGS. 7A and 7B, a model 702 of the cache 104 (FIG. 1A) with storage for the address and data contained in each cache line and a flag indicating the state of the cache line (e.g., MESI state or other cache coherency protocol state) is created. In one embodiment, initially, it may be desirable to store only pointers 704, one for each cache line, in the cache model and to later dynamically store the contents of each cache line, including its address and data, as it is being allocated by memory. Thus, memory for pointers corresponding to the cache lines is initially provided. A valid bit may further be provided to indicate whether a particular pointer is valid. When a line in the cache memory 104 is allocated by the bus master, a corresponding location in system memory for tracking by cache model 702 of the line is also allocated. A value corresponding to this location is then used as a pointer 704 to that memory location to allow for updates and status checking when transactions associated with or affecting the line occur. This arrangement may result in less storage space requirements. For example, if each pointer block 704 is of 4 bytes and if the cache size is 4K, then an initial storage space of only 16 kB is required. This is a substantial saving in storage space when compared with storage requirements for the whole cache—i.e., for example, if each cache line stores 4 bytes of address, 32 bytes of data and 1 byte of flag bits, then for a cache of 4K size, a minimum storage space of 148 KB would be required.

In another approach, a linked list can be created in the cache model object 702 to store each cache line as it is being accessed. Although this method results in less storage space than the pointer-based approach, it nonetheless increases search operation time due to its sequential nature of cache line search. In contrast, an array of cache pointers can be effectively utilized to randomly access a cache line.

The cache model object 702 also contains a dynamically allocated cycle list 703 configured to store pointers to non-cache cycles (i.e., bus cycle state machine objects corresponding to busses other than the cache bus) that are initiated in the multi-bus system. Referring to FIG. 7B, an operational scheme to check cache coherency and utilization is depicted. Each non-cache bus cycle in the initiator cycle list (block 214 in FIGS. 1B and 3A) sends a Check Cache message to the cache model 702 as represented by block 706 in FIG. 7B. Each cache bus cycle sends an Update Cache message to the cache model object 702, as shown by blocks 708 and 709 in FIG. 7B. Each cache bus cycle will be stored in the target cycle list 216 (FIGS. 1B and 3A), whereas non-cache bus cycles may be in the initiator cycle list 214 (FIGS. 1B and 3A) obtaining its resolution from various cycle objects, as discussed previously with respect to FIG. 1B.

Update Cache messages serve to update the cache model state. Update Cache messages also serve as signals to instruct the cache model 702 to perform coherency tests on pending non-cache bus cycles in the cycle list 703. As each non-cache bus cycle enters its TARGPEN state, i.e., a state indicating that all protocol tests have been successfully completed, it sends a Finish Check Cache message to the cache model 702 as shown by the block 710 in FIG. 7B. The bus cycle state machine object representation of each bus cycle in the bus bridge system and various cycle completion and data resolution mechanisms employing these state machine objects were described previously. The FINISH state is the last state in the sequence of state transitions for a bus cycle state machine object. The Finish Check Cache message indicates that no further coherency tests are to be performed on the non-cache bus cycle that sent the Finish Check Cache message. A more detailed description follows.

As each non-cache bus cycle is created, it sends a Check Cache message with a pointer to itself to the cache model (Block 706). The cache model 702 determines an initial testing state for the non-cache bus cycle dependent upon the type of the bus cycle, the presence of the memory address in the cache and the state of the cache line if the address is present in the cache. The pointer to that bus cycle and its initial testing state, are then stored in the dynamically allocated cycle list 703. The pointer may be treated as an object contained by the cache object 702. As each new non-cache bus cycle is initiated, a pointer entry is placed on the bottom of the cycle list 703.

Cache cycles send Update Cache messages to the cache model 702 when they have completely determined their data. These Update Cache messages include the physical address of the cache line accessed, the data, and a flag indicating if the access was a read or write. The cache model 702, in turn, uses these messages to keep its internal line state up-to-date and to perform coherency and efficiency checks.

All testing pertaining to each bus cycle is performed on the receipt of Update Cache messages. When an Update Cache message is received, the dynamically allocated list 703 contained in the cache object is searched from the top to bottom, i.e. from the oldest to the newest cycle entry, for an initiated bus cycle whose address matches the address sent by the Update Cache message. When such a bus cycle is found, depending on the cycle's assigned initial testing state (block 704, FIG. 7A), a series of tests are performed and the cycle's testing state is updated. In one embodiment, these tests are performed to determine whether coherency in the system has been properly maintained. For example, depending upon the state of a cache line which is accessed as a result of a particular cycle, other cycles such as DRAM cycles may also be invoked in response to the initiator cycle. The test status information maintained and provided by the cache model may include information regarding the type of cycles which should be invoked as a result of the initiator cycle for proper resolution. Certain tests may further be scheduled and conducted to determine whether the state of a cache line has been updated properly, whether certain cycles should be aborted, etc, as desired, depending upon the particular cache operation being verified. Failed tests may indicate a failure in the system with respect to coherency.

When each non-cache bus cycle transitions to the FINISH state, it sends a Finish Check Cache message to the cache object 702 as shown by block 710 in FIG. 7B. This message signals that all updates of test state for the given non-cache cycle should be complete. Upon receipt of the Finish Check Cache message, the test state for that bus cycle is checked. If the test state for that cycle is not "passed", then an error message is recorded in the cycle history file described previously. The error message can be retrieved by printing or accessing the contents of the cycle history file. A scheme similar to that described with reference to FIG. 3A, i.e. having an error file to store the test data can also be conveniently employed. After the error message has been recorded or the cycle has passed any coherency tests conducted, the pointer to the cycle in the cycle list 703 is removed.

In the above cache-master verification system, each bus cycle in the initiator cycle list 214 (FIG. 1B) polls the cache verification model 702 (FIG. 1B) to determine if its address is currently stored in the cache. If the address is in the cache model 702, then that bus cycle in the initiator cycle list 214 uses this information in combination with other system data to determine the source of its target resolution cycles.

When a cache copyback cycle due to non-INV snoops occurs, it is placed in the target list 216 as well as in the initiator cycle list 214 (FIG. 1B). The PCI read cycle that generated the snoop, and which itself will be in the initiator list, will obtain its resolution from the copyback cycle in the target list. The copyback cycle in the initiator list will obtain its resolution from the DRAM cycle. Thus, a partial cache write can be coherently resolved. A cache read cycle, caused by cache line replacements, is, however, placed in the initiator cycle list 214. It will be resolved by the resulting DRAM write in the target list 216. Thus, a methodology to reliably and efficiently detect cache coherency errors in all bus cycles is provided, in addition to detection of inefficient cache use by a cache controller.

The system described above may thus allow multiple test simulations in a multi-bus environment. The various system objects may interact according to the command flow diagram of FIG. 1B and the discussion above. When a complete resolution, on a cycle-by-cycle basis, is achieved, both the initiator cycle list and the target cycle list should be empty. The objects discussed above e.g. the stimulator object, the bus cycle state machine objects, the bus objects, the cycle lists, the cache model etc., may be instantiated by declaring them in the MAIN function supported by the C++ programming language and stored in an appropriate system memory.

It is noted that the present discussion refers to the assertion of various signals. As used herein, a signal is "asserted" if it conveys a value indicative of a particular condition. Conversely, a signal is "deasserted" if it conveys a value indicative of a lack of a particular condition. A signal may be defined to be asserted when it conveys a logical zero value or, conversely, when it conveys a logical one value.

In a situation when bus cycles to addresses are aborted without being completed, the corresponding bus cycle state machine objects may sense this through the bus stimulus being received from the stimulator object and may be configured to automatically transition their states, in response thereto, to the FINISH state or destroy themselves without further transitioning their states. Thus, failures due to aborted bus transactions may be eliminated. In addition, the system may also monitor and record bus bridge performance, and may also verify correct behavior of the bus bridge cache master.

Hence, an efficient and reliable transaction checking system for verifying bus bridges in multi-master bus systems has been disclosed. By treating each bus cycle as an individual persistent object, the system ensures that all cycles initiated by bus masters reach their destinations without corruption of cycle address or data.

Numerous variations and modifications will become apparent to those skilled in the art once the above disclosure is fully appreciated. Therefore, it is intended that the following claims be interpreted to embrace all such variations and modifications.

What is claimed:

1. A computer system for verifying operation of a bus bridge comprising:
    a stimulator object stored in a memory in said computer system, said stimulator object being configured to provide a bus stimulus;
    a plurality of bus objects stored in said memory, each of said plurality of bus objects being configured to monitor said bus stimulus and to instantiate one of a plurality of bus cycle state machine objects upon detection of an initiation of a corresponding bus cycle;
    an initiator cycle list stored in said memory, wherein said initiator cycle list being configured to dynamically store a first plurality of bus cycle state machine objects instantiated upon initiation of bus cycles by bus masters; and
    a target cycle list stored in said memory, wherein said target cycle list being configured to dynamically store a second plurality of bus cycle state machine objects instantiated upon initiation of bus cycles to be sent to a plurality of bus targets, wherein said initiator cycle list and said target cycle list being dynamically allocated to receive said bus stimulus from said stimulator object and to combinedly interact with at least one of said plurality of bus objects to verify operation of said bus bridge.

2. The computer system according to claim 1, wherein said stimulator object provides said bus stimulus on a clock cycle basis.

3. The computer system according to claim 2, wherein said stimulator object is further configured to provide a current cycle count on a clock cycle basis to said plurality of bus objects, said initiator cycle list and said target cycle list, wherein at least one of said plurality of bus objects, said initiator cycle list and said target cycle list is configured to generate at least one of a plurality of predetermined messages in response to said bus stimulus and said current cycle count received from said stimulator object.

4. The computer system as in claim 3, further comprising a statistics keeping object stored in said memory, wherein said statistics keeping object is configured to receive and analyze said at least one of said plurality of predetermined messages to monitor performance of and resource utilization for said bus bridge.

5. The computer system as in claim 1, wherein said initiator cycle list and said target cycle list combinedly interact with said at least one of said plurality of bus objects on a clock cycle basis.

6. The computer system according to claim 1, wherein a state transition by said one of said plurality of bus cycle state machine objects is in response to said bus stimulus.

7. The computer system as in claim 1, wherein said each of said plurality of bus objects is configured to store said one of said plurality of bus cycle state machine objects into a corresponding one of said initiator cycle list and said target cycle list.

8. The computer system according to claim 1, further comprising:

a first storage object stored in said memory, wherein said first storage object is associated with said initiator cycle list to store said first plurality of bus cycle state machine objects; and a second storage object stored in said memory, wherein said second storage object is associated with said target cycle list to store said second plurality of bus cycle state machine objects.

9. The computer system as in claim 1, further comprising a bus bridge object stored in said memory, said bus bridge object having storage space allocated for each configuration register in said bus bridge, thereby facilitating monitoring of a current state of said bus bridge.

10. The computer system according to claim 9, wherein at least one of said plurality of bus cycle state machine objects is configured to poll said bus bridge object to verify signals being asserted by said bus bridge in each bus protocol.

11. The computer system as in claim 9, further comprising a cache model object stored in said memory, wherein said cache model object is configured to dynamically store a plurality of pointers, wherein said plurality of pointers are stored in said cache model object by said first plurality of bus cycle state machine objects, wherein said cache model object is further configured to dynamically store therein a plurality of cache lines from a cache coupled to said bus bridge, wherein said cache model object is further configured to receive a plurality of signals from said group of said first plurality of bus cycle state machine objects and from a group of said second plurality of bus cycle state machine objects, and wherein said cache model object is further configured to verify coherency status of said cache upon receipt of said plurality of signals.

12. The computer system according to claim 11, wherein said cache model object is further configured to obtain configuration data thereof by polling said bus bridge object.

13. The computer system as in claim 1, further comprising a combine cycle list stored in said memory, wherein said combine cycle list is configured to dynamically store a plurality of combinable bus cycle state machine objects instantiated upon initiation of a corresponding plurality of combinable bus cycles, wherein said combine cycle list and a posted write buffer in said bus bridge have an equal number of entries, and wherein each of said plurality of combinable bus cycle state machine objects stored in said initiator cycle list is configured to interact with said second plurality of bus cycle state machine objects from said target cycle list and with said plurality of combinable bus cycle state machine objects from said combine cycle list to resolve one of said corresponding plurality of combinable bus cycles.

14. A method to resolve a bus cycle in a computer system, said method comprising:
   instantiating a bus cycle state machine object upon an initiation of said bus cycle;
   configuring a stimulator object to provide a bus stimulus to said bus cycle state machine object;
   configuring said bus cycle state machine object to monitor said bus stimulus and to sense therefrom an indication of said bus cycle being aborted; and
   further configuring said bus cycle state machine object to complete its state transition despite receipt of said indication of said bus cycle being aborted, thereby facilitating resolution of said bus cycle.

* * * * *